(12) United States Patent
Li et al.

(10) Patent No.: US 6,211,054 B1
(45) Date of Patent: Apr. 3, 2001

(54) METHOD OF FORMING A CONDUCTIVE LINE AND METHOD OF FORMING A LOCAL INTERCONNECT

(75) Inventors: Li Li, Meridian; Yongjun Jeff Hu, Boise, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/323,749

(22) Filed: Jun. 1, 1999

(51) Int. Cl.$^7$ .................................................. H01L 21/335
(52) U.S. Cl. ........................ 438/618; 438/655; 438/683
(58) Field of Search ............................. 438/618, 305, 438/592, 655, 649, 683, 754, 659, 931

(56) References Cited

U.S. PATENT DOCUMENTS

| 5,888,903 | * | 3/1999 | O'Brien et al. | 438/649 |
| 5,891,785 | * | 4/1999 | Chang | 438/305 |
| 6,025,117 | * | 2/2000 | Nakano et al. | 430/314 |

FOREIGN PATENT DOCUMENTS

2543581 * 10/1984 (FR) .............................. H01L/21/31

OTHER PUBLICATIONS

Monget, C., et al., "Application of Plasma Polymerized MethylSilane for 0.18 μm Photolithography", 10 pages (undated).

* cited by examiner

Primary Examiner—Matthew Smith
Assistant Examiner—Igwe U. Anya
(74) Attorney, Agent, or Firm—Wells, St. John, Roberts, Gregory & Matkin P.S.

(57) ABSTRACT

The invention includes methods of forming conductive lines, such as local interconnects. In one implementation, a method of forming a conductive line includes depositing a first layer comprising polymer silicon on a substrate. A metal layer is deposited at least over some portion of the first layer. After depositing the metal layer, the substrate is exposed to annealing conditions effective to form a metal silicide over the at least some portion. The metal silicide is provided into a desired conductive line shape. In one implementation, a method of forming a conductive line includes depositing a first layer comprising polymer silicon or amorphous silicon on a substrate. Only a portion of the first layer is exposed to both oxygen and ultraviolet light effective to transform at least an outer part of the portion to oxidized silicon. After the exposing to both oxygen and ultraviolet light, a metal layer is deposited at least over some portion of the first layer which was not subjected to the effective exposing to the combination of oxygen and ultraviolet light. After depositing the metal layer, the substrate is exposed to annealing conditions effective to form a metal silicide over the at least some portion. After the annealing, metal is removed from the metal layer which has not been transformed to metal silicide substantially selective relative to metal which has been so transformed.

45 Claims, 8 Drawing Sheets

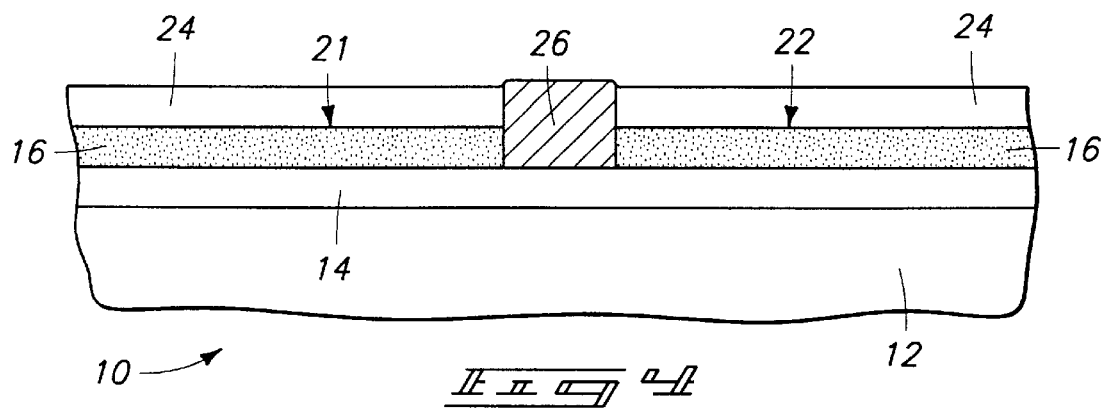
_Fig. 4_
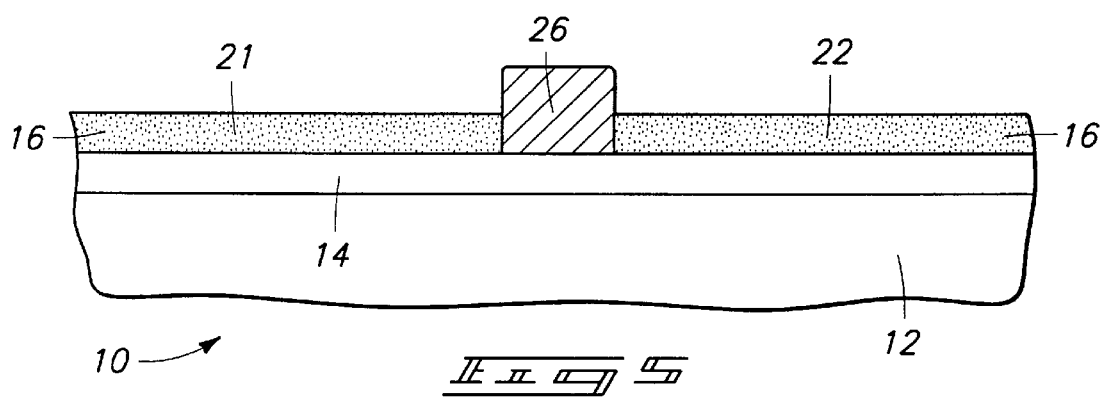
_Fig. 5_
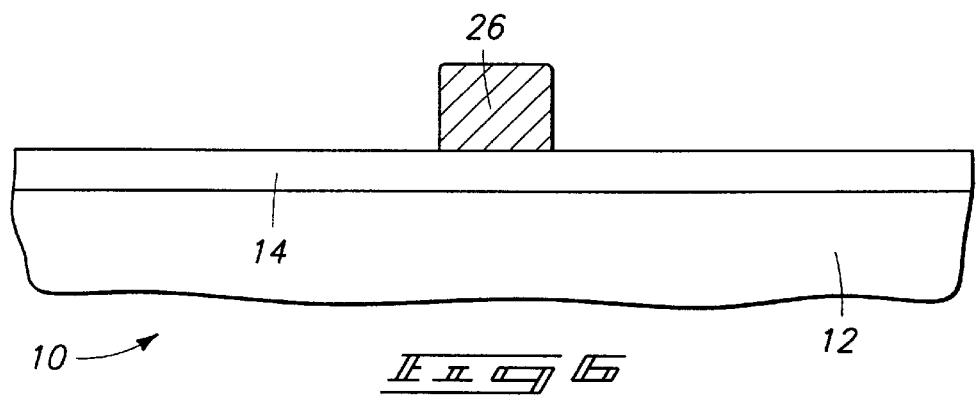
_Fig. 6_

METHOD OF FORMING A CONDUCTIVE LINE AND METHOD OF FORMING A LOCAL INTERCONNECT

TECHNICAL FIELD

This invention relates to methods of forming conductive lines, and more specifically to methods of forming local interconnects.

BACKGROUND OF THE INVENTION

The reduction in memory cell and other circuit size in high density dynamic random access memories (DRAMs) and other circuitry is a continuing goal in semiconductor fabrication. Implementing electric circuits involves connecting isolated devices through specific electric paths. When fabricating silicon and other semiconductive materials into integrated circuits, conductive devices built into semiconductive substrates typically need to be isolated from one another. Such isolation typically occurs in the form of either trench and refill field isolation regions or LOCOS grown field oxide.

Conductive lines, for example transistor gate lines, are formed over bulk semiconductor substrates. Some lines run globally over large areas of the semiconductor substrate. Others are much shorter and associated with very small portions of the integrated circuitry. This invention was principally motivated in making processing improvements in the fabrication of local interconnects, although the invention is not so limited. As device dimensions continue to shrink, so do the size of local interconnects.

SUMMARY

The invention includes methods of forming conductive lines, such as local interconnects. In one implementation, a method of forming a conductive line includes depositing a first layer comprising polymer silicon on a substrate. A metal is deposited at least over some portion of the first layer and a metal silicide is formed from reaction of the metal with silicon of the polymer silicon over the at least some portion. The metal silicide is provided into a desired conductive line shape.

In one implementation, a method of forming a conductive line includes depositing a first layer comprising polymer silicon or amorphous silicon on a substrate. Only a portion of the first layer is exposed to both oxygen and ultraviolet light effective to transform at least an outer part of the portion to oxidized silicon. After the exposing to both oxygen and ultraviolet light, a metal layer is deposited at least over some portion of the first layer which was not subjected to the effective exposing to the combination of oxygen and ultraviolet light. After depositing the metal layer, the substrate is exposed to annealing conditions effective to form a metal silicide over the at least some portion. After the annealing, metal is removed from the metal layer which has not been transformed to metal silicide substantially selective relative to metal which has been so transformed.

BRIEF DESCRIPTION OF THE DRAWINGS

Preferred embodiments of the invention are described below with reference to the following accompanying drawings.

FIG. 4 is a view of the FIG. 1 wafer at a processing step subsequent to that shown by FIG. 3.

FIG. 5 is a view of the FIG. 1 wafer at a processing step subsequent to that shown by FIG. 4.

FIG. 6 is a view of the FIG. 1 wafer at a processing step subsequent to that shown by FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
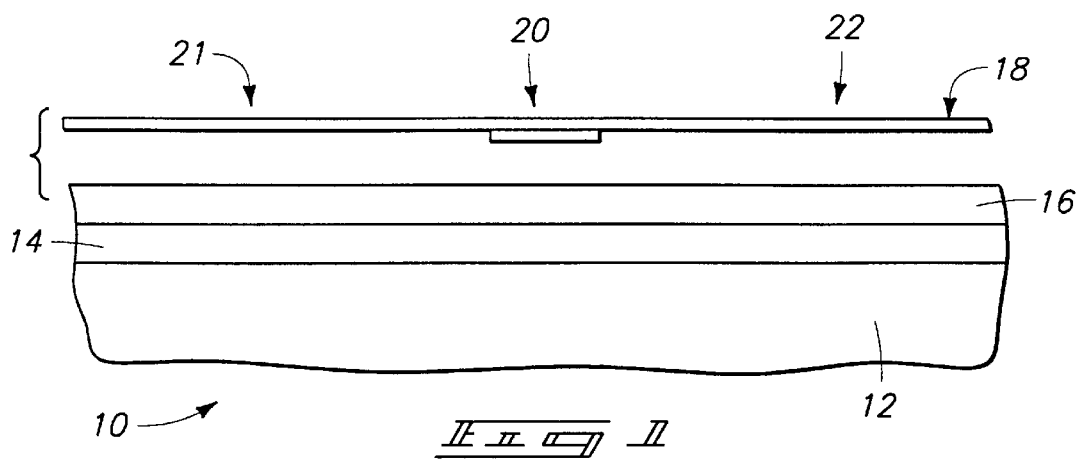
FIG. 1 is a diagrammatic fragmentary view of a semiconductor wafer fragment at one processing step in accordance with the invention.

A first embodiment method of forming a conductive line in accordance with but some partial aspects of the invention is described with reference to FIGS. 1–7. Referring first to FIG. 1, a semiconductor wafer fragment is indicated generally with reference numeral 10 and comprises a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 14 is provided over substrate 12, with $SiO_2$ and $Si_3N_4$ being but two examples. A first layer 16 comprising polymer silicon or amorphous silicon is formed on substrate 14/12. Amorphous silicon can be deposited by conventional or to-be-developed techniques, for example by physical vapor deposition (PVD) using an elemental amorphous, monocrystalline or polycrystalline silicon target. An example preferred thickness for layer 16 is 300 Angstroms.

A preferred deposited polymer silicon preferably comprises an amorphous structure having Si—Si backbonds, with plasma polymerized methylsilane being but one example. Plasma polymerized methylsilane, for example, can be deposited in a low power RF plasma at a temperature preferably less than 150° C. using methylsilane gas as a precursor. Pressure is preferably maintained at from about 1 Torr to about 2.5 Torr, with RF power preferably falling within the range of from about 60 watts to 200 watts. In accordance with one aspect of the invention, only a portion of the outer portion of layer 16 will be exposed to both oxygen and ultraviolet light effective to transform at least an outer part of the portion to oxidized silicon. A preferred method for masking only a portion includes utilizing a photolithographic mask, such as exemplary mask 18. Such includes an opaque region 20 and trans parent exposure regions 21 and 22. Alternately but less preferred, some masking layer could be deposited onto substrate 10 over layer 16, and patterned to provide desired masked and unmasked regions. In the illustrated example, masked or opaque region 20 of mask 18 is preferably provided in the shape of the conductive line being formed. Thereby, the portion of layer 16 that is not subjected to the ultraviolet light and oxygen exposure will be formed in the desired shape of a conductive line such that subsequent patterning thereof may not be required.

Figure 2:
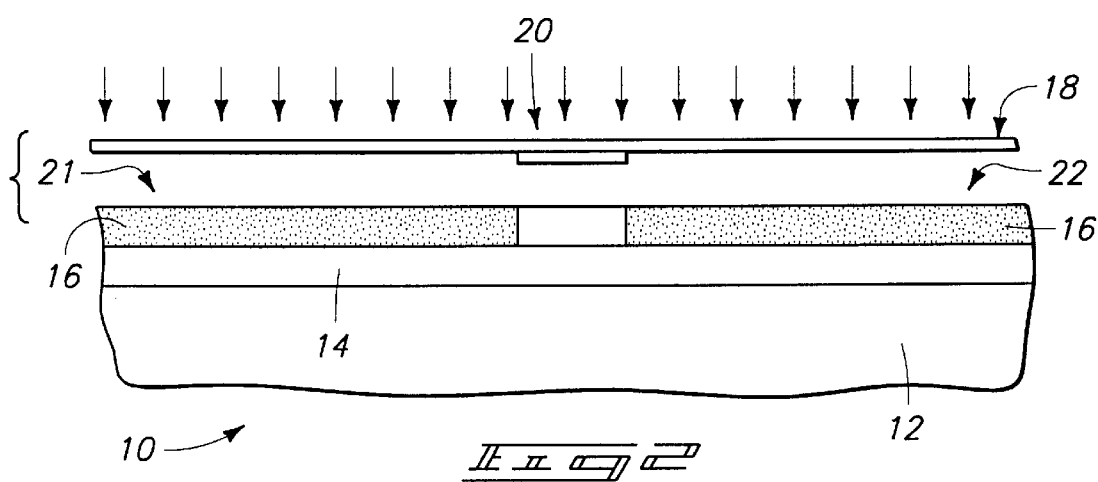
FIG. 2 is a view of the FIG. 1 wafer at a processing step subsequent to that shown by FIG. 1.

Referring to FIG. 2, and preferably in room ambient, ultraviolet light is impinged upon mask 18 and accordingly through unmasked portions 21 and 22 such that corresponding portions of first layer 16 are exposed to both oxygen and ultraviolet light effective to transform at least the outer exposed portions of layer 16 to oxidized silicon. Preferably and as shown, the exposing is effective to transform all of corresponding portions 21 and 22 of layer 16 to oxidized silicon. Preferred ultraviolet light is at a wavelength of 193 or 248 nanometers. An example preferred wafer plane intensity is 100 $mJ/cm^2$. In room ambient, the oxygen exposure will predominantly comprise $O_2$. That portion of layer 16 beneath opaque mask region 20 will be exposed to $O_2$ but not ultraviolet light during the exposing. The typical effect when using the preferred plasma polymerized methylsilane is transformation of the exposed portions into oxidized silicon in the form of a transparent glass-like siloxane. Amorphous silicon can also undergo sufficient transformation to an oxidized silicon when exposed to both ultraviolet light and oxygen, but not necessarily oxygen alone.

Figure 3:
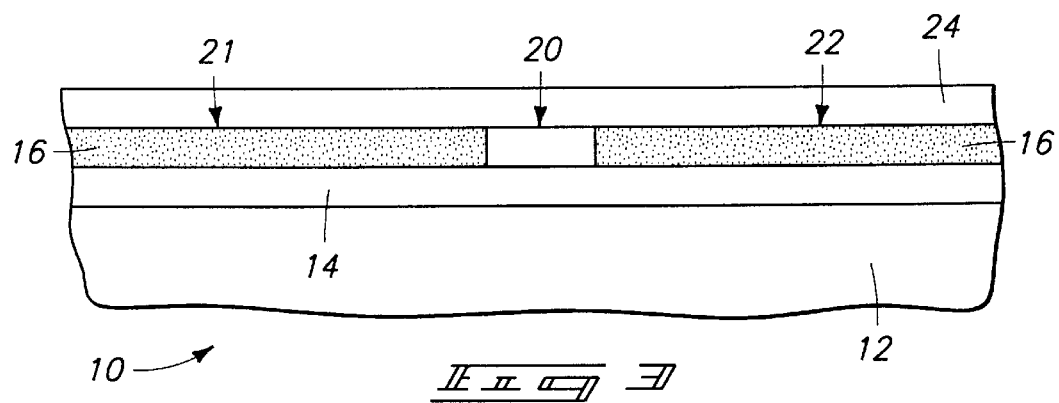
FIG. 3 is a view of the FIG. 1 wafer at a processing step subsequent to that shown by FIG. 2.

Referring to FIG. 3, mask 18 has been removed and a metal layer 24 deposited over at least some portion of layer 16 which was not subjected to the effective exposing to the combination of oxygen and ultraviolet light. As shown, layer 24 is preferably globally deposited over the substrate such that it overlies both transposed portions 21 and 22, and unexposed portion 20. Preferred materials for layer 24 are refractory metals, for example tungsten and cobalt. An example preferred thickness for layer 24 is 150 Angstroms.

Referring to FIG. 4, the substrate is exposed to annealing conditions effective to form a metal silicide region 26 over the unexposed portion. That portion of layer 24 overlying the oxidized silicon remains largely unreacted as the deposited metal. Example silicidation processing includes conventional furnace annealing in an inert gas at a temperature of from 400° to 600° C. at ambient pressure for approximately 30 minutes.

FIGS. 3 and 4 depict preferred processing where the silicide is formed by depositing a metal layer and subsequently subjected it to an anneal to cause reaction of the metal with silicon of the polymer to form a silicide. Alternate methods could be utilized to from slicide from reaction of a metal with silicon of the polymer to form a silicide. By way of example only, the silicide could be formed by reaction of the metal with silicon of the polymer during depositing of the metal, by providing suitably high temperature, for example at least 600° C. The silicide in such instance might be formed all or in part with metal deposition.

Referring to FIG. 5, unreacted metal 24 which has not been formed to metal silicide is removed substantially selectively relative to the metal which has been so transformed to produce silicide line 26. Such is preferably accomplished using conventional or to-be-developed wet or dry etching techniques. For example, a mixture of water, 30% ammonium hydroxide, and 30% hydrogen peroxide in a 5:1:1 volumetric ratio, respectively, conducted at 65° C., will strip titanium selectively relative to titanium silicide and the oxidized silicon. Alternately by way of example only, a mixture of water, 30% HCl, 30% $H_2O_2$ in a 5:1:1 respective volumetric ratio at 75° C. will selectively strip cobalt relative to cobalt silicidie and oxidized silicon.

Figure 7:
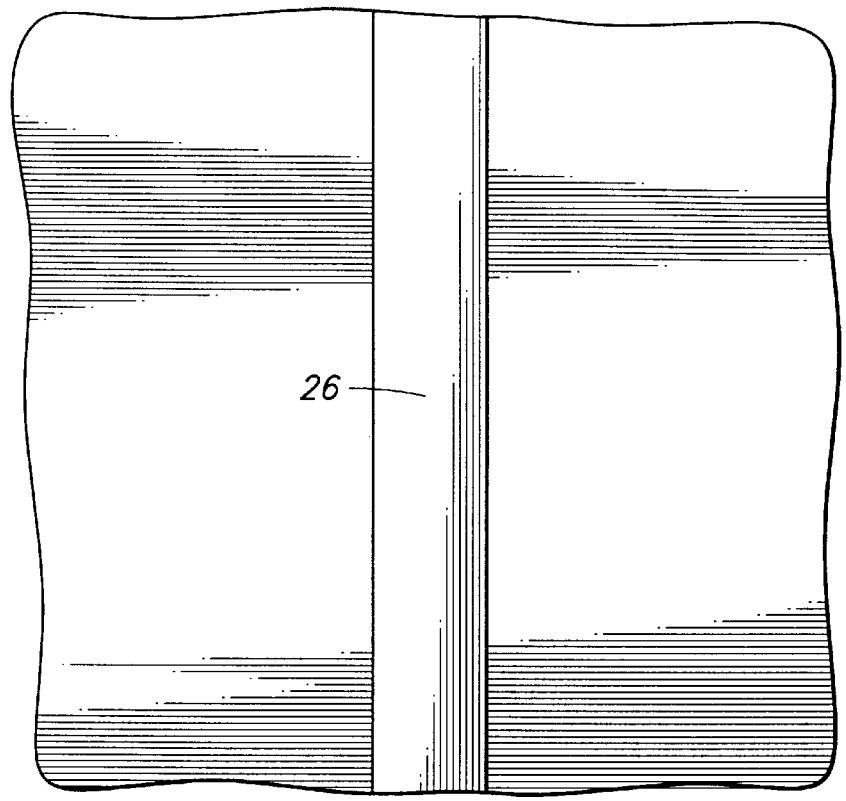
FIG. 7 is a top plan view of FIG. 6.

Remaining exposed oxidized regions 21 and 22 of layer 16 might be removed or remain. FIGS. 6 and 7 show removal of layer 16 such that only silicide line 26 remains from layer 16. An example preferred 11 etching chemistry for removing layer 16 selectively relative to silicide line 26 includes a mixture of HF, $NH_4F$ and water.

It might be desirable to expose the silicided region to a plasma comprising a hydrogen component after the annealing, particularly where the polymer silicon comprises carbon whereby such plasma hydrogen can facilitate driving carbon from the transformed portion. Example preferred plasma exposure gases include $NH_3$ and $H_2$. Preferred processing parameters for the plasma exposure in a single wafer, parallel plate capacitively coupled reactor include a temperature range of from about 100° C. to about 500° C., a pressure range of from about 1 mTorr to about 30 Torr, hydrogen component gas flow at about 100 sccm, argon gas flow at from about 100 sccm to about 500 sccm, with total plasma downflow power at 1000 watts, and processing time at approximately one minute.

The exemplary depicted processing of FIG. 5 through FIG. 7 depicts removal of the substantial entirety of the transformed portion of layer 16 from the substrate after the annealing. Alternately by way of example only, a predominate part of transformed layer 16 could be removed or not any appreciable part of portions 21 and 22 from layer 16 removed. Further alternately by way of example only, transformed regions 21 and 22 of layer 16 could be removed prior to deposition of layer 24, and thereby prior to its annealing (not shown).

Figure 8:
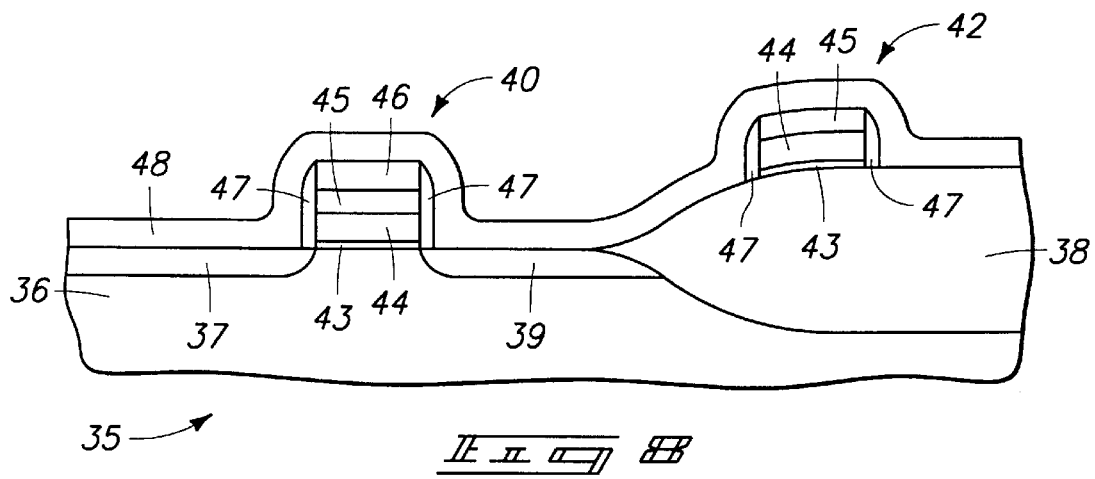
FIG. 8 is a diagrammatic fragmentary view of another semiconductor wafer fragment at one processing step in accordance with the invention.

The above-depicted example depicts an exemplary line 26 essentially formed over a large expanse of the wafer or circuitry being processed. Alternately, of course, a shorter line such as a local interconnect could be fabricated. One such preferred local interconnect fabrication method in accordance with an aspect of the invention is described with reference to FIGS. 8–13. Referring initially to FIG. 8, a semiconductor wafer fragment 35 includes a bulk monocrystalline silicon substrate 36 and a field isolation oxide region 38 formed therein. At least two transistor gates 40 and 42 have been formed over substrate 36. Lines 40 and 42 comprise gate dielectric layers 43, conductive regions 44 (preferably polysilicon), and overlying higher conductive regions 45 (preferably a silicide such as $WSi_x$). An insulating cap 46 and sidewall spacers 47 are provided as part of gate construction 40, whereby spacers 47 are provided with gate construction 42 and the outer surface of conductive region 45 is left outwardly exposed. Source/drain regions 37 and 39 are formed in substrate 36. A local interconnect layer 48 is formed over the two gates and substrate therebetween, and comprises polymer silicon or amorphous silicon as described above. An exemplary preferred thickness for layer 48 is 300 Angstroms.

Figure 9:
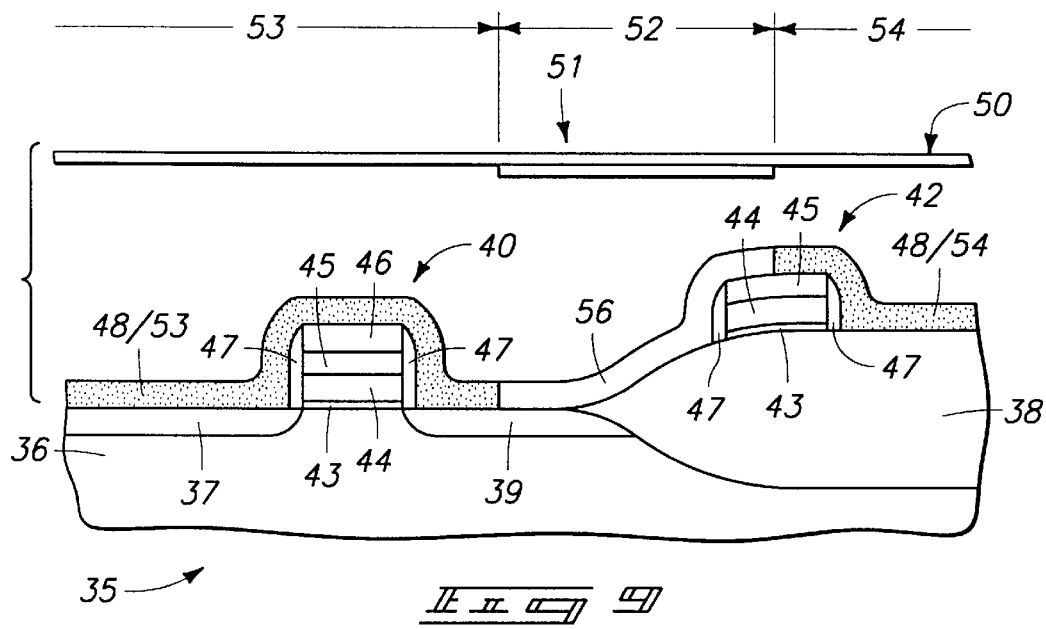
FIG. 9 is a view of the FIG. 8 wafer at a processing step subsequent to that shown by FIG. 8.

Referring to FIG. 9, a mask 50 is utilized having an opaque portion 51 to effectively mask a first portion 52 of local interconnect layer 48 while leaving exemplary other portions 53 and 54 exposed. First portion 52 is in the shape of a local interconnect line 56 extending from over one of the at least two transistor gates, here gate 42, to source/drain region 39 associated with transistor gate 40. With mask 50 in place, portions 53 and 54 are exposed to both oxygen and ultraviolet light, for example as described above, effective to transform at least an outer part of portions 53 and 54 of layer 48 to oxidized silicon.

Figure 10:
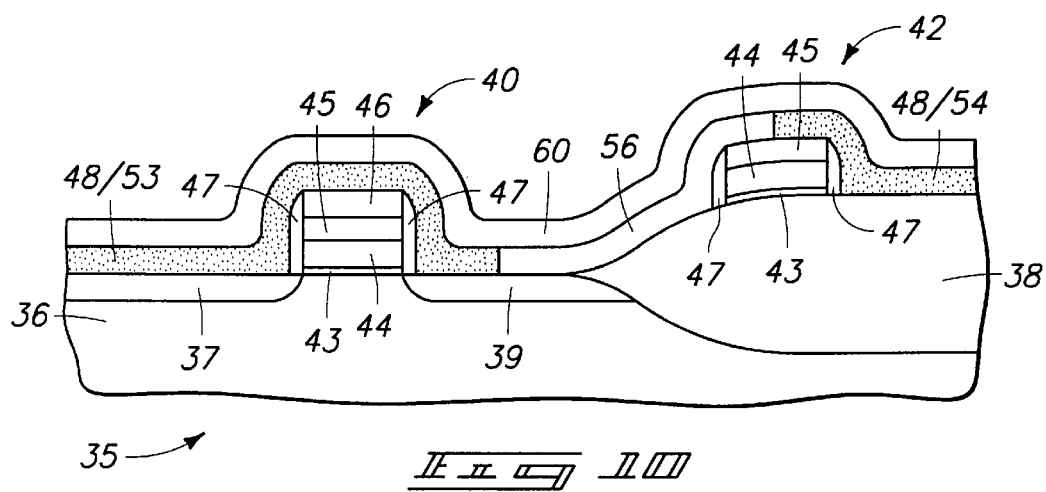
FIG. 10 is a view of the FIG. 8 wafer at a processing step subsequent to that shown by FIG. 9.

Referring to FIG. 10, a metal layer 60 such as described above is deposited at least over the first portion of local interconnect layer 48 which was masked during the exposing. Preferably and as shown, metal layer 60 is deposited over the entirety of the substrate.

Figure 11:
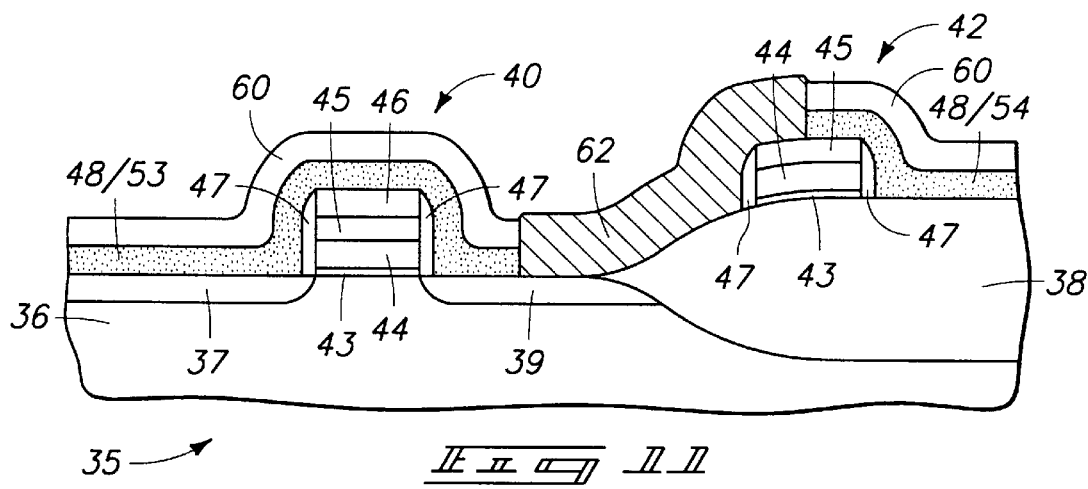
FIG. 11 is a view of the FIG. 8 wafer at a processing step subsequent to that shown by FIG. 10.

Referring to FIG. 11, the substrate is then exposed to annealing conditions, such as those described above, effective to form a metal silicide 62 of the first portion which electrically interconnects transistor gate 42 with source/drain region 39 associated with transistor gate 40. Alternately as referred to above, silicide could be formed all or in part during metal deposition.

Figure 12:
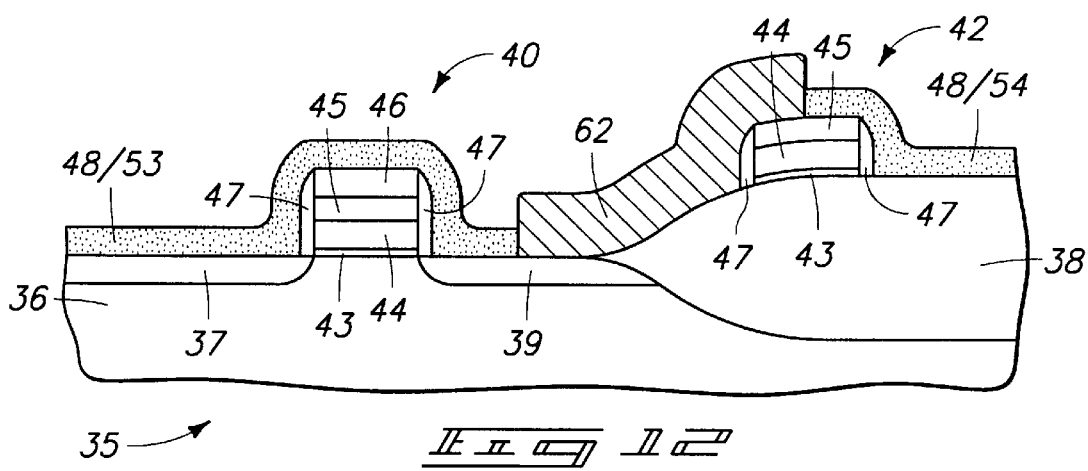
FIG. 12 is a view of the FIG. 8 wafer at a processing step subsequent to that shown by FIG. 11.

Referring to FIG. 12, metal from metal layer 60 which has not been transformed to metal silicide region 62 is substantially selectively removed relative to the metal which has been so transformed. Such removing can occur as described above or by other techniques.

Figure 13:
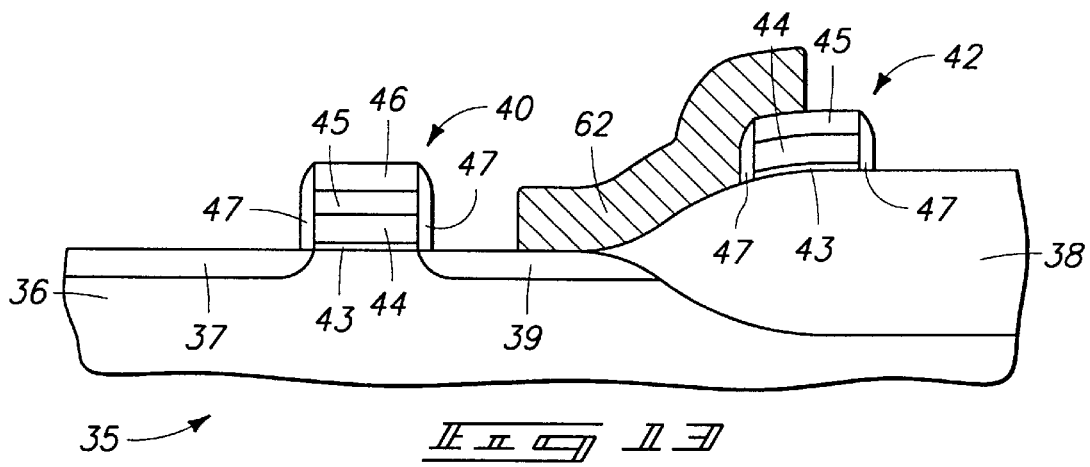
FIG. 13 is a view of the FIG. 8 wafer at a processing step subsequent to that shown by FIG. 12.

Some or all of transformed regions 53 and 54 of layer 48 might remain on the wafer, or be removed therefrom as depicted in FIG. 13.

Figure 14:
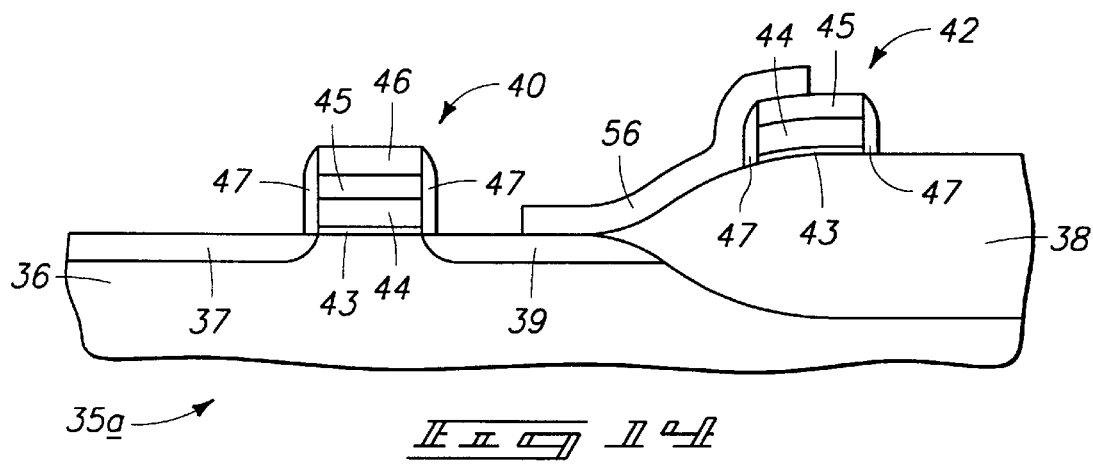
FIG. 14 is a diagrammatic fragmentary view of another semiconductor wafer fragment at one processing step in accordance with the invention.

The above-described specific local interconnect embodiment left transformed portions 53 and 54 of local interconnect layer 48 on the wafer during the annealing. FIGS. 14–17 illustrate an alternate embodiment whereby such material is removed prior to metal layer deposition and accordingly prior to anneal. Like numerals from the second described embodiment are utilized where appropriate, with differences being indicated with the suffix "a" or with different numerals. Referring first to FIG. 14, such is a depiction of a processing step immediately subsequent to that depicted by FIG. 9 in the second described embodiment. In FIG. 14, regions 53 and 54 of local interconnect layer 48 have been removed from the substrate 35a.

Figure 15:
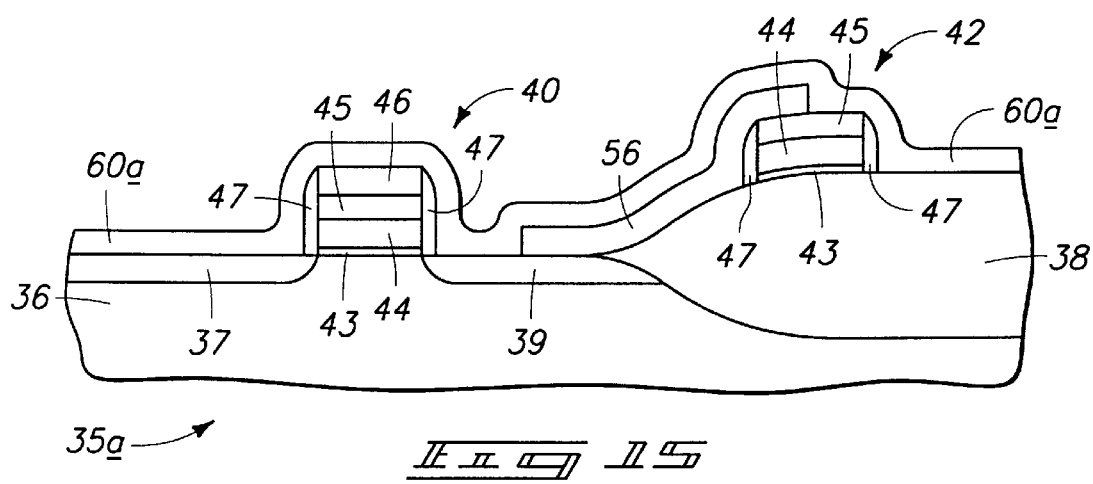
FIG. 15 is a view of the FIG. 14 wafer at a processing step subsequent to that shown by FIG. 14.

Referring to FIG. 15, a metal layer 60a is deposited over the substrate 35a.

Figure 16:
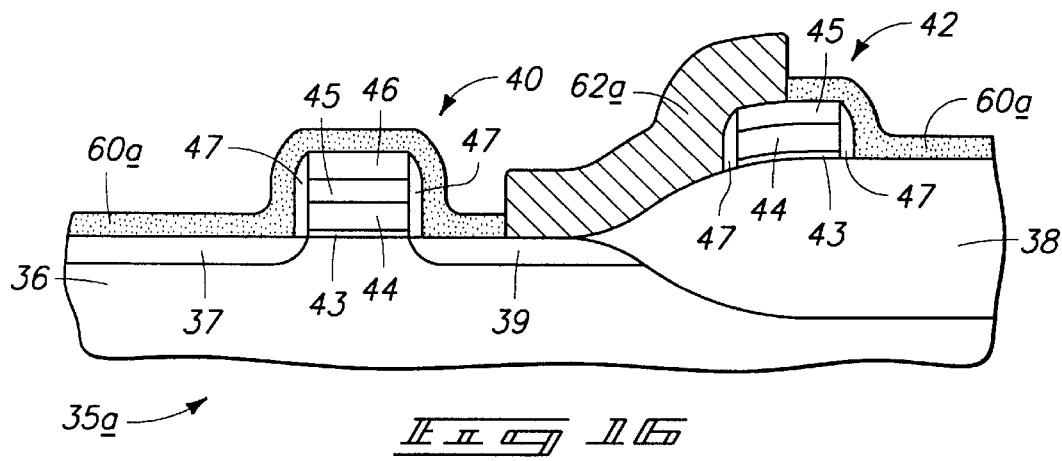
FIG. 16 is a view of the FIG. 14 wafer at a processing step subsequent to that shown by FIG. 15.

Referring to FIG. 16, the substrate is subjected to a suitable silicidation anneal to form silicide region 62a from metal layer 60a.

Figure 17:
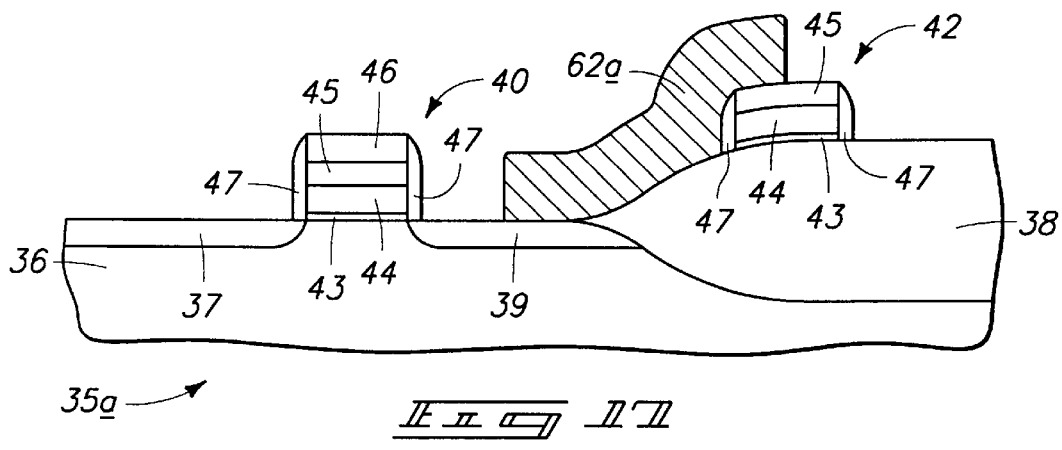
FIG. 17 is a view of the FIG. 14 wafer at a processing step subsequent to that shown by FIG. 16.

Referring to FIG. 17, the unreacted metal of layer 60a is subsequently stripped from the wafer leaving local interconnect 62a.

The invention further contemplates a method of forming a conductive line comprising depositing a first layer comprising polymer silicon on a substrate. A metal layer is deposited at least over some portion of the first layer and a metal silicide is formed from reaction of the metal with silicon of the polymer silicon over the at least some portion. The metal silicide is provided into a desired conductive line shape. The preferred providing comprises patterning the metal silicide after the annealing. Alternately by way of example, the providing comprises patterning at least one of the metal layer and first layer prior to the annealing.

One exemplary embodiment is described with reference to FIG. 18–FIG. 20. A wafer fragment 70 comprises a bulk monocrystalline silicon substrate 72 having an insulative layer 73 formed thereover. A polymer silicon layer 74, for example as described above, is formed over substrate 72. A metal layer 76 is provided over polymer silicon layer 74.

Figure 19:
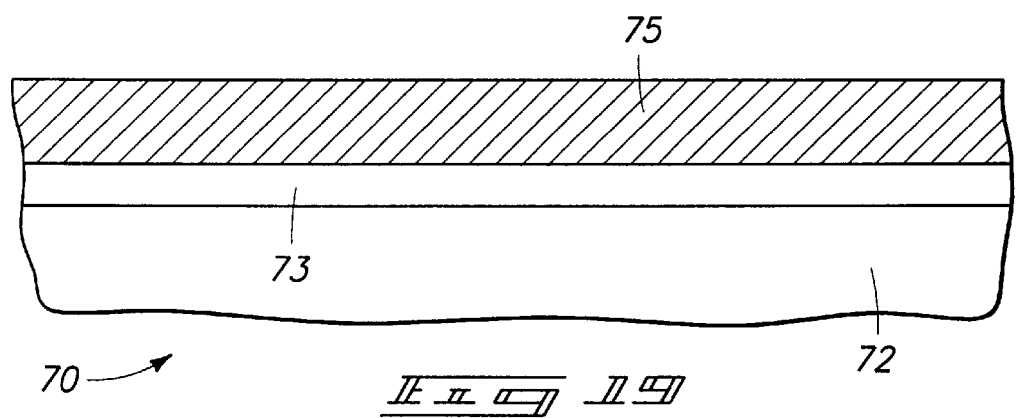
FIG. 19 is a view of the FIG. 18 wafer at a processing step subsequent to that shown by FIG. 18.

Referring to FIG. 19, wafer fragment 70 is subjected to suitable annealing conditions, such as described above, effective to form a metal silicide layer 75 from layers 74 and 76. Alternately as referred to above, silicide could be formed all or in part during metal deposition.

Figure 20:
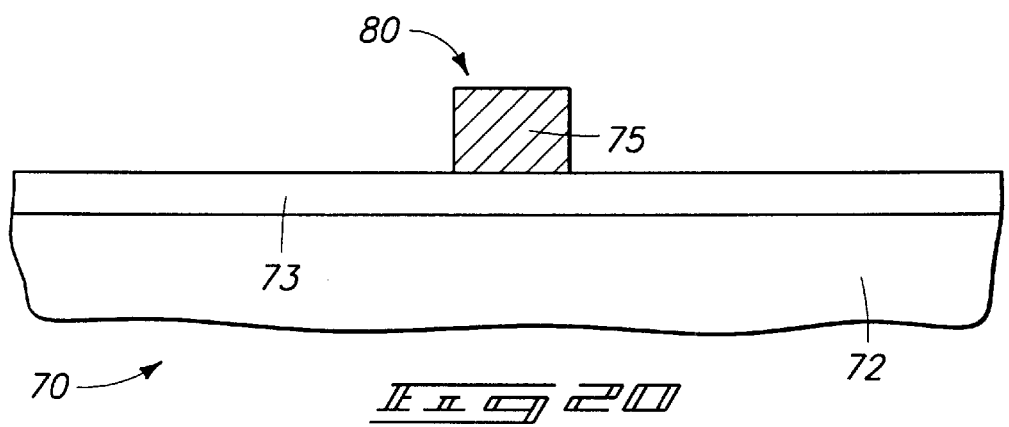
FIG. 20 is a view of the FIG. 18 wafer at a processing step subsequent to that shown by FIG. 19.

Referring to FIG. 20, silicide layer 75 is fabricated into a conductive line 80.

Figure 18:
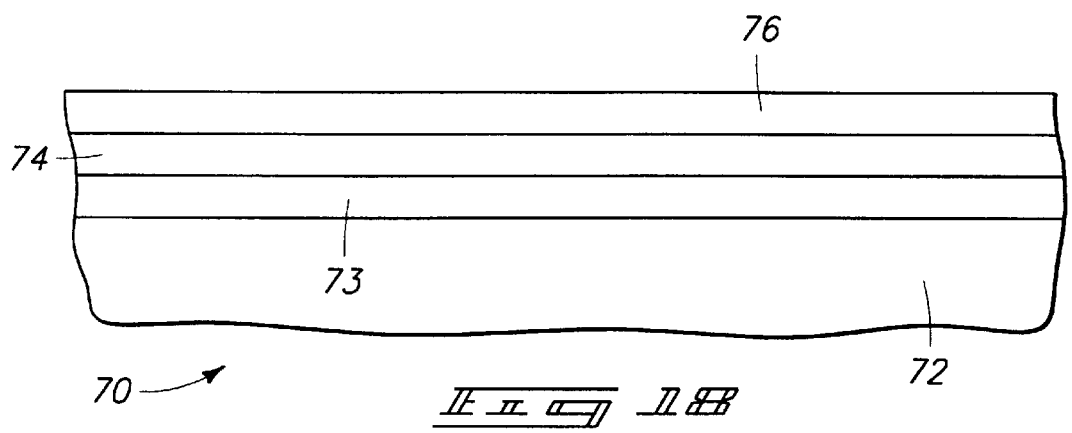
FIG. 18 is a diagrammatic fragmentary view of another semiconductor wafer fragment at one processing step in accordance with the invention.

Alternately by way of example only, layer 74 in FIG. 18 could have been patterned into some desired line shape prior to depositing layer 76. Alternately, layer 76 could be patterned into some desired line shape prior to anneal. Alternately, layers 76 and 74 could be patterned into some desired line shape prior to anneal.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of a conductive line comprising:
    depositing a first layer comprising polymer silicon on a substrate;
    depositing a metal at least over some portion of the first layer and forming a metal silicide from reaction of the metal with silicon of the polymer silicon over the at least some portion; and
    providing the metal silicide into a desired conductive line shape.

2. The method of claim 1 wherein the providing comprises patterning the metal silicide after its formation.

3. The method of claim 1 wherein the providing comprises patterning at least the polymer silicon prior to depositing the metal.

4. The method of claim 1 wherein the forming comprises reaction of the metal with silicon of the polymer during depositing of the metal.

5. The method of claim 1 wherein the forming comprises:
    depositing a layer of the metal; and
    after the depositing, exposing the substrate to annealing conditions effective to form a metal silicide over the at least some portion.

6. The method of claim 5 wherein the providing comprises patterning at least one of the metal layer and first layer prior to the annealing.

7. The method of claim 1 wherein the conductive line is in the form of a local interconnect.

8. The method of claim 1 wherein the polymer silicon comprises an amorphous structure having Si—Si backbonds.

9. The method of claim 8 wherein the polymer silicon comprises plasma polymerized methylsilane.

10. The method of claim 1 further comprising exposing at least a portion of the metal silicide to a plasma comprising a hydrogen component.

11. The method of claim 1 wherein the polymer silicon comprises carbon, the method further comprising exposing at least a portion of the metal silicide to a plasma comprising a hydrogen component to drive carbon from the transformed portion.

12. A method of forming a conductive line comprising:
depositing a first layer comprising polymer silicon or amorphous silicon on a substrate;
exposing only a portion of the first layer to both oxygen and ultraviolet light effective to transform at least an outer part of the portion to oxidized silicon;
after the exposing to both oxygen and ultraviolet light, depositing a metal at least over some portion of the first layer which was not subjected to the effective exposing to the combination of oxygen and ultraviolet light and forming a metal silicide from reaction of the metal and silicon of the polymer over the at least some portion; and
after the forming, removing deposited metal which has not been formed to metal silicide substantially selective relative to metal which has been so formed.

13. The method of claim 12 wherein the forming comprises reaction of the metal with silicon of the polymer during depositing of the metal.

14. A method of forming a conductive line comprising:
depositing a first layer comprising polymer silicon or amorphous silicon on a substrate;
exposing only a portion of the first layer to both oxygen and ultraviolet light effective to transform at least an outer part of the portion to oxidized silicon;
after the exposing to both oxygen and ultraviolet light, depositing a metal layer at least over some portion of the first layer which was not subjected to the effective exposing to the combination of oxygen and ultraviolet light;
after depositing the metal layer, exposing the substrate to annealing conditions effective to form a metal silicide over the at least some portion; and
after the annealing, removing metal from the metal layer which has not been transformed to metal silicide substantially selective relative to metal which has been so transformed.

15. The method of claim 14 wherein the removing comprises wet etching.

16. The method of claim 14 wherein the portion of the first layer that is not subjected to the effective exposing to the combination of oxygen and ultraviolet light is in the shape of the conductive line being formed.

17. The method of claim 16 wherein the conductive line is in the form of a local interconnect.

18. The method of claim 14 wherein the oxygen comprises $O_2$.

19. The method of claim 14 wherein the exposing of only a portion of the first layer to both oxygen and ultraviolet light is effective to transform all of said portion to oxidized silicon.

20. The method of claim 14 comprising removing at least a predominate part of the portion of the first layer subjected to the effective exposing to the combination of oxygen and ultraviolet light prior to the annealing.

21. The method of claim 14 comprising removing at least a predominate part of the portion of the first layer subjected to the effective exposing to the combination of oxygen and ultraviolet light after the annealing.

22. The method of claim 14 comprising not removing any appreciable part of the portion of the first layer subjected to the effective exposing to the combination of oxygen and ultraviolet light either before or after the annealing.

23. The method of claim 14 wherein the portion of the first layer that is not subjected to the effective exposing to the combination of oxygen and ultraviolet light is exposed to oxygen during said effective exposing to the combination.

24. The method of claim 14 wherein the depositing of the first layer comprises PVD of amorphous silicon.

25. The method of claim 14 wherein the depositing of the first layer comprises depositing polymer silicon.

26. The method of claim 25 wherein the polymer silicon comprises an amorphous structure having Si—Si backbonds.

27. The method of claim 26 wherein the polymer silicon comprises plasma polymerized methylsilane.

28. The method of claim 25 further comprising exposing at least a portion of the first layer to a plasma comprising a hydrogen component after the annealing.

29. The method of claim 25 wherein the polymer silicon comprises carbon, the method further comprising exposing at least a portion of the first layer to a plasma comprising a hydrogen component after the annealing to drive carbon from the transformed portion.

30. A method of forming a local interconnect comprising:
forming at least two transistor gates over a semiconductor substrate;
depositing a local interconnect layer over the at least two gates and substrate therebetween, the local interconnect layer comprising polymer silicon or amorphous silicon;
masking at least a first portion of the local interconnect layer while leaving a second portion of the local interconnect layer exposed, the first portion being in the shape of a local interconnect line extending from over one of the at least two transistor gates to at least one source/drain region associated with another of the at least two transistor gates;
after and while the masking is in place, exposing the second portion of the interconnect layer to both oxygen and ultraviolet light effective to transform at least an outer part of the second portion to oxidized silicon;
after the exposing to both oxygen and ultraviolet light, depositing a metal at least over the first portion of the interconnect layer and forming a metal silicide from reaction of the metal and silicon of the polymer over the first portion which electrically interconnects the one transistor gate with the one source/drain region associated with the another transistor gate; and
after forming the metal silicide, removing deposited metal which has not formed to metal silicide substantially selective relative to metal which has been so formed.

31. The method of claim 30 wherein the forming the metal silicide comprises reaction of the metal with silicon of the polymer during depositing of the metal.

32. A method of forming a local interconnect comprising:
forming at least two transistor gates over a semiconductor substrate;

depositing a local interconnect layer over the at least two gates and substrate therebetween, the local interconnect layer comprising polymer silicon or amorphous silicon;

masking at least a first portion of the local interconnect layer while leaving a second portion of the local interconnect layer exposed, the first portion being in the shape of a local interconnect line extending from over one of the at least two transistor gates to at least one source/drain region associated with another of the at least two transistor gates;

after and while the masking is in place, exposing the second portion of the interconnect layer to both oxygen and ultraviolet light effective to transform at least an outer part of the second portion to oxidized silicon;

after the exposing to both oxygen and ultraviolet light, depositing a metal layer at least over the first portion of the interconnect layer;

after depositing the metal layer, exposing the substrate to annealing conditions effective to form a metal silicide of the first portion which electrically interconnects the one transistor gate with the one source/drain region associated with the another transistor gate; and after the annealing, removing metal from the metal layer which has not been transformed to metal silicide substantially selective relative to metal which has been so transformed.

33. The method of claim 32 wherein the first portion of the local interconnect layer is exposed to oxygen during said effective exposing to the combination.

34. The method of claim 32 comprising removing at least a predominate part of the second portion of the local interconnect layer after the effective exposing to the combination of oxygen and ultraviolet light and prior to the annealing.

35. The method of claim 34 comprising removing all of the second portion of the local interconnect layer after the effective exposing to the combination of oxygen and ultraviolet light and prior to the annealing.

36. The method of claim 32 comprising removing at least a predominate part of the second portion of the local interconnect layer after the annealing.

37. The method of claim 36 comprising removing all remaining of the second portion of the local interconnect layer after the annealing.

38. The method of claim 32 comprising not removing any appreciable part of the second portion of the local interconnect layer after the effective exposing to the combination of oxygen and ultraviolet light either before or after the annealing.

39. The method of claim 32 wherein the depositing of the local interconnect layer comprises PVD of amorphous silicon.

40. The method of claim 32 wherein the depositing of the local 10 interconnect layer comprises depositing polymer silicon.

41. The method of claim 40 wherein the polymer silicon comprises an amorphous structure having Si—Si backbonds.

42. The method of claim 41 wherein the polymer silicon comprises plasma polymerized methylsilane.

43. The method of claim 40 further comprising exposing at least the first portion of the local interconnect layer to a plasma comprising a hydrogen component after the annealing.

44. The method of claim 40 wherein the polymer silicon comprises carbon, the method further comprising exposing at least the first portion of the first layer to a plasma comprising a hydrogen component after the annealing to drive carbon from the transformed portion.

45. The method of claim 32 wherein the exposing of the second portion of the interconnect layer to both oxygen and ultraviolet light is effective to transform all of the second portion to oxidized silicon.

* * * * *

UNITED STATES PATENT AND TRADEMARK OFFICE
CERTIFICATE OF CORRECTION

PATENT NO. : 6,211,054 B1                                        Page 1 of 1
DATED      : April 3, 2001
INVENTOR(S) : Li Li, et al.

It is certified that error appears in the above-identified patent and that said Letters Patent is hereby corrected as shown below:

Column 4,
Line 36, replace "preferred 11 etching" with -- preferred etching --.

Column 6,
Line 45, replace "of a conductive" with -- of forming a conductive --.

Column 10,
Line 17, replace "local 10" with -- local --.

Signed and Sealed this

Sixteenth Day of October, 2001

Attest:

NICHOLAS P. GODICI
Attesting Officer    Acting Director of the United States Patent and Trademark Office